(12) United States Patent
Liang et al.

(10) Patent No.: US 10,600,910 B2
(45) Date of Patent: Mar. 24, 2020

(54) HIGH VOLTAGE (HV) METAL OXIDE SEMICONDUCTOR FIELD EFFECT TRANSISTOR (MOSFET) IN SEMICONDUCTOR ON INSULATOR (SOI) TECHNOLOGY

(71) Applicant: QUALCOMM Incorporated, San Diego, CA (US)

(72) Inventors: Qingqing Liang, San Diego, CA (US); Ravi Pramod Kumar Vedula, San Diego, CA (US); Sivakumar Kumarasamy, San Diego, CA (US); George Pete Imthurn, San Diego, CA (US); Sinan Goktepeli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/156,729

(22) Filed: Oct. 10, 2018

(65) Prior Publication Data

US 2019/0393340 A1 Dec. 26, 2019

Related U.S. Application Data

(60) Provisional application No. 62/690,136, filed on Jun. 26, 2018.

(51) Int. Cl.
*H01L 29/78* (2006.01)
*H01L 29/66* (2006.01)
(Continued)

(52) U.S. Cl.
CPC .... *H01L 29/7824* (2013.01); *H01L 21/28035* (2013.01); *H01L 21/76251* (2013.01); *H01L 29/0865* (2013.01); *H01L 29/0882* (2013.01); *H01L 29/0886* (2013.01); *H01L 29/4916* (2013.01); *H01L 29/66484* (2013.01); *H01L 29/66681* (2013.01); *H01L 29/7831* (2013.01)

(58) Field of Classification Search
CPC combination set(s) only.
See application file for complete search history.

(56) References Cited

U.S. PATENT DOCUMENTS 5,627,394 A 5/1997 Chang et al.
6,664,598 B1 * 12/2003 Dennard ........... H01L 21/76264
257/347
(Continued)

OTHER PUBLICATIONS

International Search Report and Written Opinion—PCT/US2019/030938—ISA/EPO—dated Jul. 23, 2019.

*Primary Examiner* — Sonya D. McCall-Shepard
(74) *Attorney, Agent, or Firm* — Qualcomm Incorporated/Seyfarth Shaw LLP

(57) ABSTRACT

An integrated circuit is described. The integrated circuit includes a metal oxide semiconductor field effect transistor (MOSFET). The MOSFET is on a first surface of an insulator layer of the integrated circuit. The MOSFET including a source region, a drain region, and a front gate. The MOSFET also includes an extended drain region between the drain region and a well proximate the front gate. The integrated circuit also includes back gates on a second surface opposite the first surface of the insulator layer. The back gates are overlapped by the extended drain region.

15 Claims, 9 Drawing Sheets

(51) Int. Cl.
*H01L 29/49* (2006.01)
*H01L 21/762* (2006.01)
*H01L 29/786* (2006.01)
*H01L 27/12* (2006.01)
*H01L 21/28* (2006.01)
*H01L 29/08* (2006.01)

(56) References Cited

U.S. PATENT DOCUMENTS

| | | |
|---|---|---|
| 9,761,525 B1 | 9/2017 | Hook et al. |
| 10,043,826 B1* | 8/2018 | Li .................. H01L 29/0847 |
| 2007/0029620 A1* | 2/2007 | Nowak ............... H01L 21/743 |
| | | 257/369 |
| 2011/0171792 A1* | 7/2011 | Chang .................. G03F 9/7084 |
| | | 438/157 |
| 2012/0018806 A1* | 1/2012 | Furukawa ............... H01L 21/84 |
| | | 257/347 |
| 2013/0256800 A1* | 10/2013 | Qiao .................. H01L 27/1203 |
| | | 257/350 |
| 2015/0001623 A1* | 1/2015 | Wang ............... H01L 29/78654 |
| | | 257/347 |
| 2015/0116029 A1 | 4/2015 | Litty et al. |
| 2017/0373026 A1 | 12/2017 | Goktepeli |

* cited by examiner

HIGH VOLTAGE (HV) METAL OXIDE SEMICONDUCTOR FIELD EFFECT TRANSISTOR (MOSFET) IN SEMICONDUCTOR ON INSULATOR (SOI) TECHNOLOGY

CROSS-REFERENCE TO RELATED APPLICATION

The present application claims the benefit of U.S. Provisional Patent Application No. 62/690,136, filed Jun. 26, 2018, and titled "HIGH VOLTAGE (HV) METAL OXIDE SEMICONDUCTOR FIELD EFFECT TRANSISTOR (MOSFET) IN SEMICONDUCTOR ON INSULATOR (SOI) TECHNOLOGY," the disclosure of which is expressly incorporated by reference herein in its entirety.

TECHNICAL FIELD

The present disclosure generally relates to integrated circuits (ICs). More specifically, the present disclosure relates to high voltage (HV) metal oxide semiconductor field effect transistors (MOSFETs) in semiconductor on insulator (SOI) technology.

BACKGROUND

The design complexity of mobile radio frequency (RF) chips (e.g., mobile RF transceivers) is complicated by added circuit functions to support communications enhancements. Designing mobile RF transceivers may include using semiconductor on insulator technology. Semiconductor on insulator (SOI) technology replaces conventional semiconductor (e.g., silicon) substrates (e.g., wafers) with a layered semiconductor-insulator-semiconductor substrate for reducing parasitic device capacitance and improving performance.

SOI-based devices differ from conventional, silicon-built devices because a silicon junction is above an electrical isolator, typically a buried oxide (BOX) layer. A reduced thickness of the BOX layer, however, may not sufficiently reduce the parasitic capacitance caused by the proximity of an active device on the semiconductor layer and a semiconductor substrate supporting the BOX layer. The active devices on the SOI layer may include complementary metal oxide semiconductor (CMOS) transistors.

A high voltage power amplifier (e.g., core devices) and a high voltage switch (e.g., input/output (IO) devices) may be implemented using a type of CMOS transistor referred to as a laterally diffused metal oxide semiconductor (LDMOS) transistor. LDMOS transistors represent a type of an asymmetric power metal oxide semiconductor field effect transistor (MOSFET). LDMOS transistors are generally designed to achieve a low on-resistance and a high blocking voltage. These features may be supported by creating a diffused P-type channel region in a low-doped N-type drain region. LDMOS transistors fabricated on SOI substrates, however, suffer from reliability issues that prevent achieving the full performance potential offered by SOI technology.

SUMMARY

An integrated circuit is described. The integrated circuit includes a metal oxide semiconductor field effect transistor (MOSFET). The MOSFET is on a first surface of an insulator layer of the integrated circuit. The MOSFET includes a source region, a drain region, and a front gate. The MOSFET also includes an extended drain region between the drain region and a well proximate the front gate. The integrated circuit also includes back gates on a second surface opposite the first surface of the insulator layer. The back gates are overlapped by the extended drain region.

A method of constructing an integrated circuit is described. The method includes fabricating a metal oxide semiconductor field effect transistor (MOSFET). The MOSFET includes an extended drain region on a first surface of an insulator layer supported by a sacrificial substrate. The method also includes depositing a front-side dielectric layer on the MOSFET. The method further includes bonding a handle substrate to the front-side dielectric layer. The method also includes removing the sacrificial substrate. The method further includes fabricating back gates on a second surface opposite the first surface of the insulator layer.

An integrated circuit is described. The integrated circuit includes a metal oxide semiconductor field effect transistor (MOSFET). The MOSFET is on a first surface of an insulator layer of the integrated circuit. The MOSFET includes a source region, a drain region, and a front gate. The MOSFET also includes an extended drain region between the drain region and a well proximate the front gate. The integrated circuit also includes means for increasing a voltage tolerance of the MOSFET. The means for increasing voltage tolerance is on a second surface opposite the first surface of the insulator layer and overlapped by the extended drain region.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
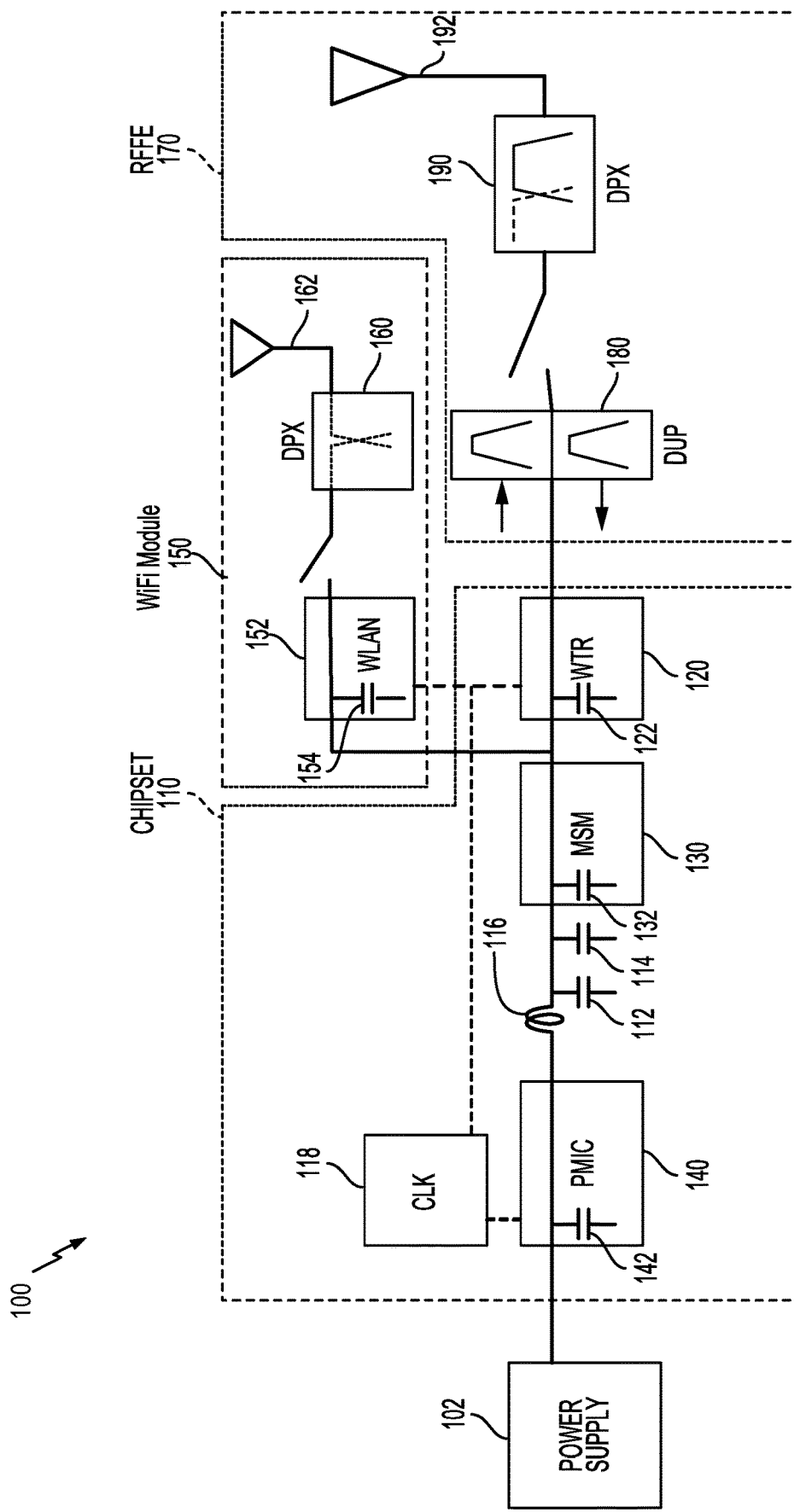
FIG. 1 is a schematic diagram of a wireless device having a wireless local area network module and a radio frequency (RF) front-end module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Designing mobile radio frequency (RF) chips (e.g., mobile RF transceivers) is complicated by adding circuit functions for supporting new communications enhancements. Semiconductor on insulator technology may be used for designing mobile RF transceivers. Semiconductor on insulator (SOI) technology replaces conventional silicon substrates with a layered semiconductor-insulator-semiconductor substrate. An SOI substrate beneficially reduces parasitic device capacitance, while improving mobile RF transceiver performance.

SOI-based devices differ from conventional, silicon-built devices. For example, in SOI-based devices, a silicon junction is above an electrical isolator, typically a buried oxide (BOX) layer. In operation, a thickness of the BOX layer determines a distance between the active devices in an SOI substrate. A sufficient distance between the active device and the SOI substrate is important for improving active device performance. Reducing device footprints for meeting specifications of future process nodes, however, reduces a thickness of the BOX layer as well as a distance between the active device and the SOI substrate. Reducing the thickness of the BOX layer in future process nodes may significantly reduce device performance. That is, device performance is degraded by increasing a proximity of the active device and the SOI substrate in future process nodes.

A mobile RF transceiver may include circuits for amplifying communications signals. The amplifier circuits may include amplifier stages having driver stages and amplifier output stages. Each of the amplifier stages includes one or more transistors configured in various ways to amplify the communications signals. Various options exist for fabricating the transistors for amplifying the communications signals transmitted and received by mobile RF transceivers. These transistors may be fabricated on an SOI substrate as complementary metal oxide semiconductor (CMOS) transistors. Similarly, high performance CMOS RF switch technologies are currently manufactured using SOI substrates. Unfortunately, successful fabrication of CMOS transistors using SOI technology is complicated by parasitic capacitance.

A high voltage power amplifier (e.g., core devices) and high voltage switching applications (e.g., input/output (IO) devices) may be implemented using a type of complementary oxide semiconductor (CMOS) transistor referred to as a laterally diffused metal oxide semiconductor (LDMOS) transistor. LDMOS transistors represent a type of asymmetric power metal oxide semiconductor field effect transistor (MOSFET). LDMOS transistors are generally designed to achieve a low on-resistance and a high blocking voltage. These features may be supported by creating a diffused P-type channel region in a low-doped N-type drain region. LDMOS transistors fabricated on SOI substrates, however, suffer from reliability issues that prevent achieving the full performance potential offered by SOI technology.

While a sustainable voltage of core (e.g., high voltage power amplifiers) and IO devices (e.g., switching applications) scales down, high voltage devices become more and more important in advanced CMOS technology. Designing a device that can survive at a high biased drain-source voltage (Vds) is traditionally achieved by using STI (shallow trench isolation), counter well doping, or a dummy gate to reduce the electrical (E)-field in the drain region (e.g., an LDMOS transistor). Unfortunately, these methods are either not applicable to SOI technology or degrade RF performance in SOI technology.

Various aspects of the present disclosure provide techniques for fabricating a high voltage (HV) MOSFET device on a semiconductor on insulator (SOI) layer with dual backside gates. The process flow for semiconductor fabrication of the HV MOSFET device may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably.

A MOSFET is generally configured as a three terminal device, with the terminals commonly identified as a gate, a source region, and a drain region. For example, a gate voltage may control current flowing from the drain to the source region of the MOSFET. In operation, the gate induces a field-enhanced depletion region between the source and drain regions for creating a "channel." A MOSFET channel is predominately defined by a physical size of the gate structure as well as the implantation and diffusion area. The source and drain regions are generally on laterally opposing sides of a gate area.

Layer transfer technology offers a unique opportunity to address some of the reliability problems incurred when fabricating high voltage MOSFET devices on SOI wafers. Using layer transfer technology enables a high voltage MOSFET device to realize the full performance potential of SOI technology. According to aspects of the present disclosure, layer transfer technology is used for forming dual backside gates overlapped by an extended drain region of a high voltage MOSFET device.

According to aspects of the present disclosure, a backside structure may serve as a first backside gate and a second backside gate when formed by depositing a thin backside oxide on a backside surface of an insulator (e.g., BOX) layer. When a front-side gate is turned off, the first and second backside gates are also at a same voltage for inhibiting charge carrier movement into an extended drain region. Inhibiting charge carrier movement into the extended drain region beneficially leads to a higher breakdown voltage of the high voltage MOSFET device.

Aspects of the present disclosure are directed to an advanced high voltage (HV) MOSFET structure in SOI technology, including multiple back gates, overlapped by an extended drain region. By applying a combination of a strong positive bias on the back gates of an N-type MOS (NMOS), the front surface of the drain region is depleted, and a maximum E-field in the HV MOSFET device is greatly reduced. In operation, a device including the HV MOSFET structure can sustain a much higher drain-source voltage (Vds) with minimum degradation of RF performance. Simulation of this multiple back gates technique yields a significant performance increase (e.g., in sustaining higher voltages) than a single back gate HV MOSFET device.

FIG. 1 is a schematic diagram of a wireless device 100 (e.g., a cellular phone or a smartphone) including the HV MOSFET device with dual back gates. The wireless device 100 has a wireless local area network (WLAN) (e.g., WiFi) module 150 and an RF front-end module 170 for a chipset 110. The WiFi module 150 includes a first diplexer 160 communicably coupling an antenna 162 to a wireless local area network module (e.g., WLAN module 152). The RF front-end module 170 includes a second diplexer 190 communicably coupling an antenna 192 to the wireless transceiver 120 (WTR) through a duplexer 180 (DUP). The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device 100 generally includes a mobile RF transceiver to transmit and receive data for two-way communications. A mobile RF transceiver may include a transmit section for data transmission and a receive section for data reception. For data transmission, the transmit section may modulate an RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna 192 and may amplify the received RF signal using a low noise amplifier (LNA) and process the received RF signal to recover data sent by the base station in a communications signal.

The wireless transceiver 120 may include one or more circuits for amplifying these communications signals. The amplifier circuits (e.g., LNA/PA) may include one or more amplifier stages that may have one or more driver stages and one or more amplifier output stages. Each of the amplifier stages includes one or more transistors configured in various ways to amplify the communications signals. Various options exist for fabricating the transistors that are configured to amplify the communications signals transmitted and received by the wireless transceiver 120.

In FIG. 1, the wireless transceiver 120 and the RF front-end module 170 may be implemented using semiconductor on insulator (SOI) technology for fabricating transistors of the wireless transceiver 120 and the RF front-end module 170, which helps reduce high order harmonics in the RF front-end module 170. SOI technology replaces conventional semiconductor substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness of the BOX layer in sub-micron process nodes, however, may not sufficiently reduce the parasitic capacitance caused by the proximity of an active device on the semiconductor layer and a semiconductor substrate supporting the BOX layer. As a result, a layer transfer process is introduced to further separate the active device from the substrate, as shown in FIGS. 2A to 2D.

Figure 2A:
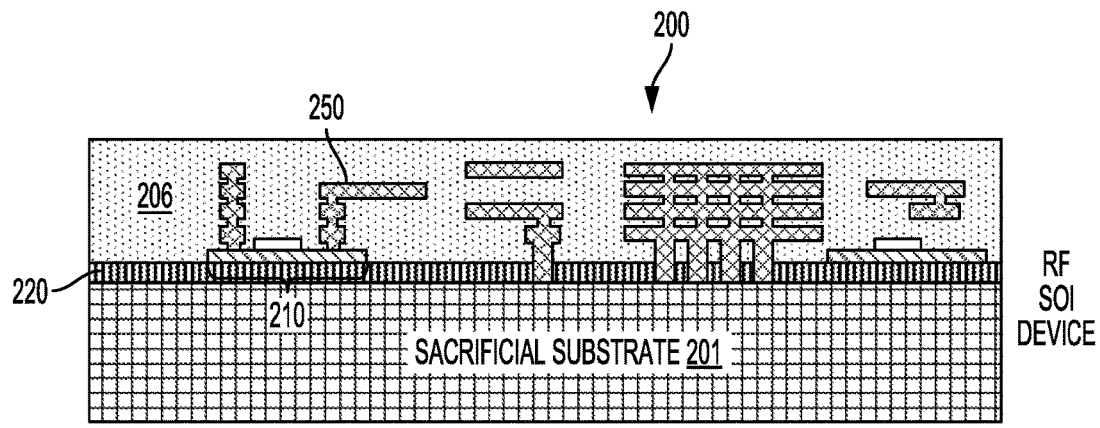
FIGS. 2A to 2D show cross-sectional views of a radio frequency (RF) integrated circuit during a layer transfer process, according to aspects of the present disclosure.
Figure 2B:
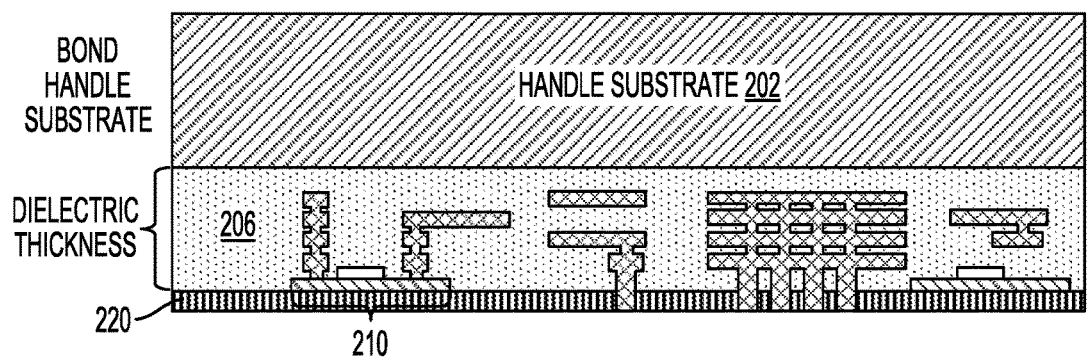

FIGS. 2A to 2D show cross-sectional views of a radio frequency (RF) integrated circuit 200 during a layer transfer process, according to aspects of the present disclosure. As shown in FIG. 2A, an RF silicon on insulator (SOI) device includes an active device 210 on a buried oxide (BOX) layer 220 supported by a sacrificial substrate 201 (e.g., a bulk wafer). The RF SOI device also includes interconnects 250 coupled to the active device 210 within a first dielectric layer 206. As shown in FIG. 2B, a handle substrate 202 is bonded to the first dielectric layer 206 of the RF SOI device, opposite the BOX layer 220. In addition, the sacrificial substrate 201 is removed. Removal of the sacrificial substrate 201 using the layer transfer process enables high-performance, low-parasitic RF devices by increasing the dielectric thickness. That is, a parasitic capacitance of the RF SOI device is proportional to the dielectric thickness, which determines the distance between the active device 210 and the handle substrate 202.

Figure 2C:
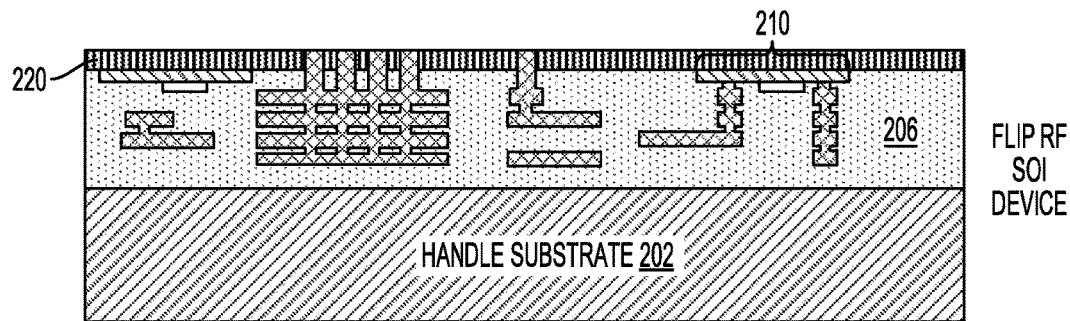
Figure 2D:
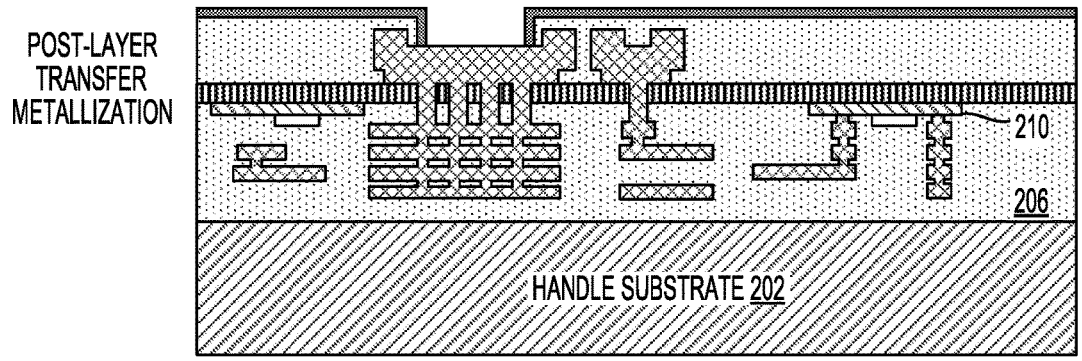

As shown in FIG. 2C, the RF SOI device is flipped once the handle substrate 202 is secured and the sacrificial substrate 201 is removed. As shown in FIG. 2D, a post layer transfer metallization process is performed using, for example, a regular complementary metal oxide semiconductor (CMOS) process.

The active device 210 on the BOX layer 220 may be a complementary metal oxide semiconductor (CMOS) transistor in the layer transfer process shown in FIGS. 2A to 2D. The wireless transceiver 120 of FIG. 1 may include RF power amplifiers and high voltage switching applications that use a high voltage MOSFET dual back gate structure fabricated using the layer transfer process shown in FIGS. 2A to 2D, according to aspects of the present disclosure.

Figure 3:
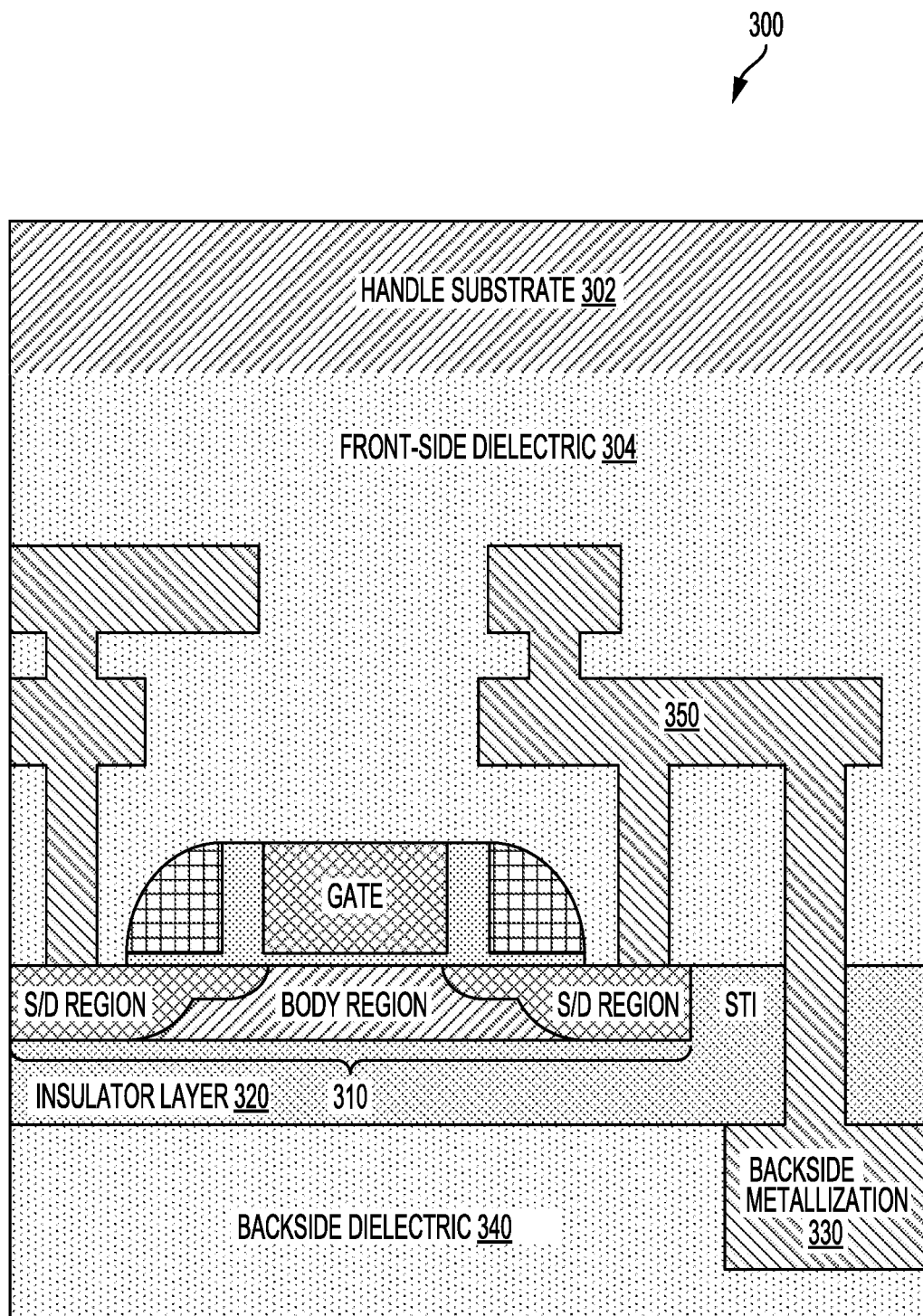
FIG. 3 is a cross-sectional view of a radio frequency (RF) integrated circuit fabricated using a layer transfer process.

FIG. 3 is a cross-sectional view of an RF integrated circuit 300 fabricated using a layer transfer process. Representatively, the RF integrated circuit 300 includes an active device 310 having a gate, a body, and source/drain (S/D) regions formed on an insulator layer 320. In SOI implementations, the insulator layer 320 is a buried oxide (BOX) layer, and the body and source/drain regions are formed from an SOI layer (e.g., silicon) including shallow trench isolation (STI) regions supported by the insulator layer 320. A body contact may be tied to the source region of the active device 310. Alternatively, the active device 310 may be configured as a four terminal device according to a body-in-source (BIS) configuration.

The RF integrated circuit 300 also includes middle-of-line (MOL)/back-end-of-line (BEOL) interconnects coupled to the source/drain regions of the active device 310. As described herein, the MOL/BEOL layers are referred to as front-side layers. By contrast, the layers supporting the insulator layer 320 may be referred to herein as backside layers. According to this nomenclature, a front-side metallization 350 is coupled to the source/drain regions of the active device 310 and arranged in a front-side dielectric layer 304. In addition, a handle substrate 302 is coupled to the front-side dielectric layer 304. In this example, a backside dielectric layer 340 is adjacent to and possibly supports the insulator layer 320. A backside metallization 330 is coupled to the front-side metallization 350. The front-side metallization 350 may be a front-side back-end-of-line (BEOL) interconnect and the backside metallization 330 may be a backside back-end-of-line (BEOL) interconnect. According to aspects of the present disclosure, the active device 310 may be fabricated using a high voltage, dual back gate MOSFET structure, for example, as shown in FIGS. 4 and 5.

Figure 4:
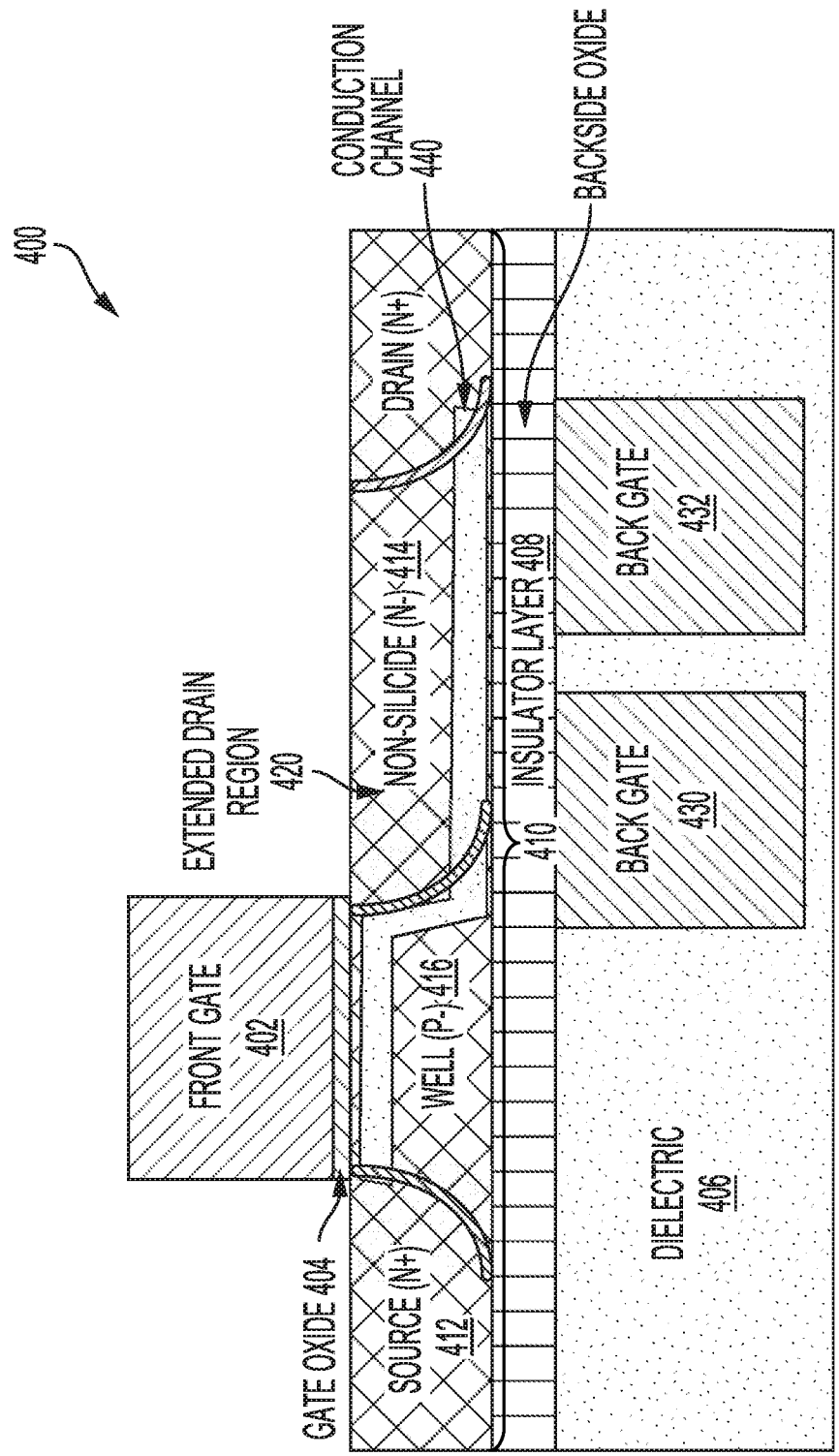
FIG. 4 is a cross-sectional view of an N-type high voltage (HV) metal oxide semiconductor (MOS) field effect transistor (FET) device on a semiconductor on insulator (SOI) layer with dual back gates fabricated using a layer transfer process, according to aspects of the present disclosure.
Figure 5:
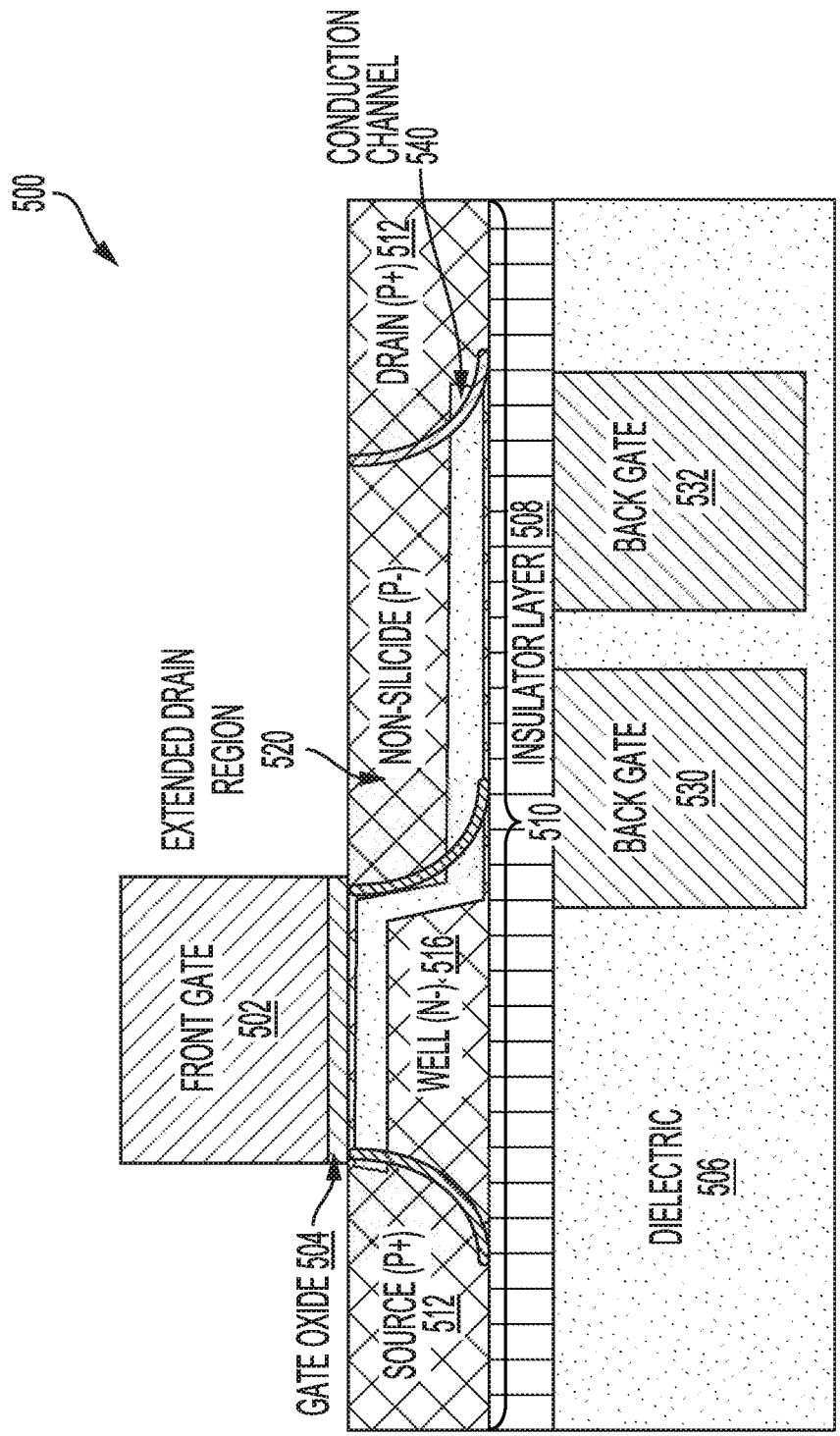
FIG. 5 is a cross-sectional view of a P-type high voltage (HV) metal oxide semiconductor (MOS) field effect transistor (FET) device on a semiconductor on insulator (SOI) layer with dual back gates fabricated using a layer transfer process, according to aspects of the present disclosure.

FIG. 4 is a cross-sectional view of an integrated circuit, including an N-type MOSFET device on a semiconductor on insulator (SOI) layer with multiple back gates fabricated using a layer transfer process, according to aspects of the present disclosure. Layer transfer technology offers a unique opportunity to address some of the reliability problems incurred when fabricating high voltage MOSFET devices on SOI wafers. Layer transfer technology enables high voltage MOSFET devices to realize the full performance potential of SOI technology.

Representatively, an RF integrated circuit 400 includes an active device 410 having a front gate 402, a P-type (P-) well (P-well) 416, and a gate oxide 404 between the P-well 416 and the front gate 402. The active device 410 also includes an N-type source region 412 (N+), and an N-type drain region 414 (N+), formed on an insulator layer 408. In SOI implementations, the insulator layer 408 is a buried oxide (BOX) layer, and the P-well 416, the N-type source region 412 and the N-type drain region 414 are formed from an SOI layer (e.g., a silicon layer) supported by the insulator layer 408. In this configuration, the active device 410 is implemented using a high voltage MOSFET structure, having an N-type (N-) extended drain region 420 between the P-well 416 and the N-type drain region 414 of the active device 410. The high voltage MOSFET structure is shown in an N-type field effect transistor (NFET) configuration, although other configurations are possible.

The layer transfer shown in FIGS. 2A-2D offers a unique opportunity to address some of the reliability problems incurred when fabricating high voltage MOSFET devices on SOI wafers. According to aspects of the present disclosure, layer transfer technology is used for forming multiple back gates on a high voltage MOSFET structure. As described herein, the term "back gate" may refer to a backside gate biased independently of both a front-side gate (e.g., the front gate 402) and a source region. If a back gate is connected to a front gate, it is essentially acting as a field plate, but with considerably reduced gate-to-drain capacitance because it is not in proximity to a drain metal.

For example, as shown in FIG. 4, a first back gate 430 and a second back gate 432 are formed on a second surface opposite a first surface of the insulator layer 408. The first back gate 430 and the second back gate 432 may be formed by depositing a layer of a semiconductor material (e.g., polysilicon) or a conductive material (e.g., copper) on the second surface of the insulator layer 408. A backside dielectric 406 is deposited on the second surface of the insulator layer 408 and on the first back gate 430 and the second back gate 432. A length of the first back gate 430 and the second back gate 432 may be in the range of 0.5 to 1.5 microns, and a thickness of the first back gate 430 and the second back gate 432 may be approximately 270 nanometers.

According to aspects of the present disclosure, the first back gate 430 and the second back gate 432 may serve as second and third gates of the active device 410 when formed by depositing a thin backside oxide on the second surface of the insulator layer 408. When the front gate 402 is turned off, the first back gate 430 and the second back 432 may be at the same off-voltage for inhibiting charge carrier movement into the extended drain region 420. Inhibiting charge carrier movement into the extended drain region 420 beneficially leads to a higher breakdown voltage of the active device 410. Furthermore, performing a retrograde implant in the extended drain region 420, in combination with the first back gate 430 and the second back gate 432, may create a conduction channel 440 when the active device 410 is turned on.

In one configuration, the first back gate 430 and the second back gate 432 are positioned for directing movement of charge to a backside interface between the first back gate 430, the second back gate 432, and the insulator layer 408. For example, the first back gate 430 and the second back gate 432 may be positively biased for adjusting an electric field in the extended drain region 420 of the active device 410. That is, the first back gate 430 and the second back gate 432 may control internal electron distribution by adjusting the bias in the first back gate 430 and the second back gate 432. Controlling the charge movement reduces exposure of the gate oxide to hot carrier injection, which prevents gate oxide damage. If the first back gate 430 and the second back gate 432 are biased separately from other electrodes, higher voltages can be used for enhancing desired effects. These desired effects may include a lower on-resistance as well as a higher off-breakdown voltage of the active device 410.

The first back gate 430 and the second back gate 432 may be used effectively on N-type or P-type field effect transistors (FETs). Placement of a left edge of the first back gate 430 to overlap the front gate 402 may be selectively varied for improving an on-resistance and/or reducing parasitic capacitance. Placement of the right edge of the second back gate 432 toward a drain side may also be selectively varied for improving the breakdown voltage and/or reducing the parasitic capacitance. The length of the extended drain region 420 may also be varied. The doping concentration in the extended drain region 420 may be varied. The gate lengths of the front gate 402, the first back gate 430, and the second back gate 432 may also be varied. A semiconductor (e.g., silicon) layer thickness may also be varied. A body tie for removing excess charge from a body (e.g., the P-well) may be beneficial to operating the active device 410. A backside oxide thickness, a gate oxide thickness, and/or a channel doping may also be varied.

FIG. 5 is a cross-sectional view of an integrated circuit, including a P-type MOSFET device on a semiconductor on insulator (SOI) layer with multiple back gates fabricated using a layer transfer process, according to aspects of the present disclosure. In this configuration, an RF integrated circuit 500 includes an active device 510 having a front gate 502, an N-well 516 (N-), and a gate oxide 504 between the N-well 516 and the front gate 502. In addition, the active device 510 includes a P-type source region 512 (P+) and a P-type drain region 514 (P+) formed on an insulator layer 508.

In contrast to the configuration shown in FIG. 4, in FIG. 5, the doping of the active regions of the active device 510, and optionally the front gate 502, is switched to an opposite polarity to form the active device 510 as a P-type high voltage MOSFET, having multiple back gates. In one configuration, the active device 510 includes a P-type (P-) extended drain region 520 between the N-well 516 and the P-type drain region 514 of the active device 510. In this configuration, the extended drain region 520, in combination with the first back gate 530 and the second back gate 532, may create a conduction channel 540 when the active device 510 is turned on.

In this configuration, a first back gate 530 and a second back gate 532 are also formed on a second surface opposite a first surface of the insulator layer 508. The first back gate 530 and the second back gate 532 may also be formed by depositing a layer of a semiconductor material (e.g., polysilicon) or a conductive material (e.g., copper) on the second surface of the insulator layer 508. A backside dielectric 506 is deposited on the second surface of the insulator layer 508 and on the first back gate 530 and the second back gate 532. A length of the first back gate 530 and the second back gate 532 may be in the range of 0.5 to 1.5 microns, and a thickness of the first back gate 530 and the second back gate 532 may also be approximately 270 nanometers.

According to aspects of the present disclosure, the first back gate 530 and the second back gate 532 may serve as second and third gates of the active device 510 when formed by depositing a thin backside oxide on the second surface of the insulator layer 508. When the front gate 502 is turned off, the first back gate 530 and the second back 532 may be at the same off-voltage for inhibiting charge carrier movement into the extended drain region 520. Inhibiting charge carrier movement into the extended drain region 520 beneficially leads to a higher breakdown voltage of the active device 510. The first back gate 530 and the second back gate 532 may be positioned for directing movement of charge to a backside interface between the first back gate 530, the second back gate 532, and the insulator layer 508, as described with reference to FIG. 4.

In contrast to the configuration shown in FIG. 4, the doping of the extended drain region 520 is switched to an opposite polarity to form a PN junction between the extended drain region 520 (P-) and the N-well 516. The extended drain region 520 does not include a contact (e.g., a silicide contact) for interconnecting to the extended drain region 520, which may be referred to as a non-silicide region.

The multiple back gate configurations shown in FIGS. 4 and 5 enable the active device (e.g., 410/510) to sustain a higher breakdown voltage, while maintaining the same drive current and circuit performance. Alternatively, the multiple back gate configuration enables maintaining of the breakdown voltage, to achieve a significantly (e.g., 20%) higher drive current and circuit performance relative to MOSFET configurations that do not include multiple back gates. Furthermore, the multiple back gate configurations shown in FIGS. 4 and 5 enable flexibility relative to a doping profile of the active regions because optimum bias voltages of the multiple back gates are readily adjusted to fit different doping profiles.

Although two back gates are described, additional back gates can be provided. For example, three, four, or more back gates can be provided, depending on a size of the extended drain region. Moreover, the bias points of each back gate need not be the same. The bias points can be fixed or dynamic. As a result of the multiple back gates, sensitivity to incoming wafer issues and process issues is reduced. For example, the bias voltages of the back gates can be adjusted based on a doping profile.

Figure 6:
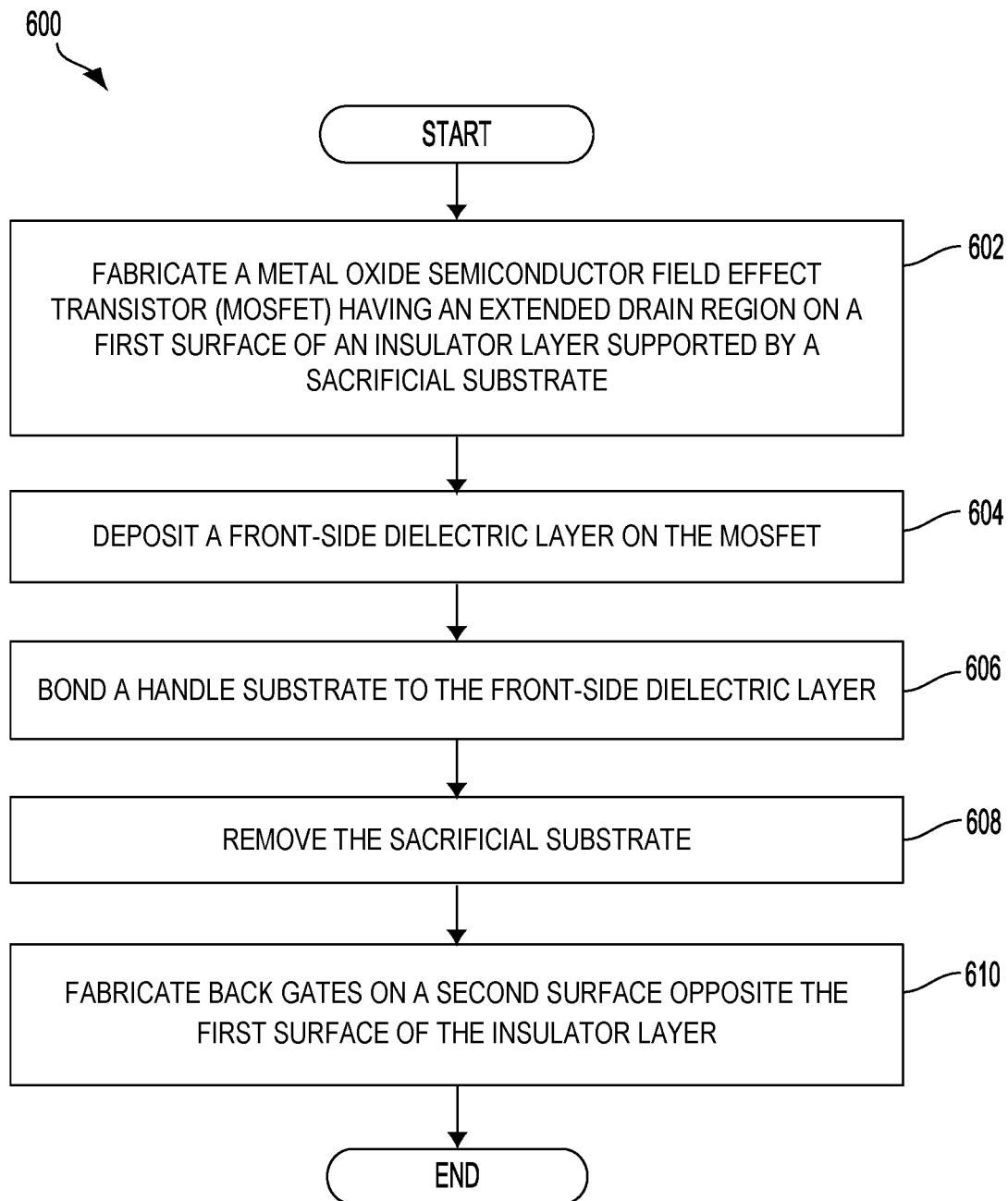
FIG. 6 is a process flow diagram illustrating a method of fabricating a high voltage (HV) metal oxide semiconductor field effect transistor (MOSFET) device on a semiconductor on insulator (SOI) layer with dual back gates, according to an aspect of the present disclosure.

FIG. 6 is a process flow diagram illustrating a method of constructing a high voltage MOSFET device having multiple back gates using a layer transfer process, according to an aspect of the present disclosure. A method 600 begins at block 602, in which a metal oxide semiconductor field effect transistor (MOSFET) having an extended drain region is fabricated on a first surface of an insulator layer. The insulator layer is supported by a sacrificial substrate. For example, as shown in FIG. 2A, an active device 210 is fabricated on a buried oxide (BOX) layer 220. In block 604, a front-side dielectric layer is deposited on the MOSFET. For example, as shown in FIG. 3, the front-side dielectric layer 304 is deposited on the active device 310.

Referring again to FIG. 6, in block 606, a handle substrate is bonded to the front-side dielectric layer. For example, as shown in FIG. 3, a handle substrate 302 is bonded to the front-side dielectric layer 304. In block 608 of FIG. 6, the sacrificial substrate is removed. As shown in FIG. 2B, the layer transfer process includes removal of the sacrificial substrate 201. In block 610, back gates are fabricated on a second surface opposite the first surface of the insulator layer. For example, as shown in FIG. 4, a first portion and a second portion of a polysilicon material/conductive material are deposited on the second surface of the insulator layer 408 to form the first back gate 430 and the second back gate 432. This process may include depositing a first portion of a polysilicon element on the second surface opposite the first surface of the insulator layer 408 to form the first back gate 430 to at least partially overlap with the front gate 402 and the extended drain region 420 of the MOSFET.

Aspects of the present disclosure are directed to an advanced high voltage MOSFET structure in SOI technology, including multiple back gates, overlapped by an extended drain region. By applying a combination of a strong positive bias on the back gates of an N-type MOS (NMOS), the front surface of the drain region is depleted, and a maximum electrical (E)-field in the HV MOSFET device is greatly reduced. In operation, a device including the HV MOSFET structure can sustain a much higher drain-source voltage (Vds) with minimum degradation of RF performance. A significant performance increase (e.g. in sustaining higher voltages) is achieved compared to a single back gate HV MOSFET device. In some cases, the front-side/front will be referred to as the first-side. In other cases, the backside/back will be referred to as the first-side. It is contemplated that the multi-back gate MOSFET could be incorporated in RF power amplifiers as well as RF switches.

According to a further aspect of the present disclosure, an integrated circuit includes a multi-back gate HV MOSFET on a first surface of an insulator layer. The integrated circuit includes means for increasing a voltage tolerance. The increasing means may be the first back gate 430 and the second back gate 432 shown in FIG. 4. In another aspect, the aforementioned means may be any layer, module or any apparatus configured to perform the functions recited by the aforementioned means.

Figure 7:
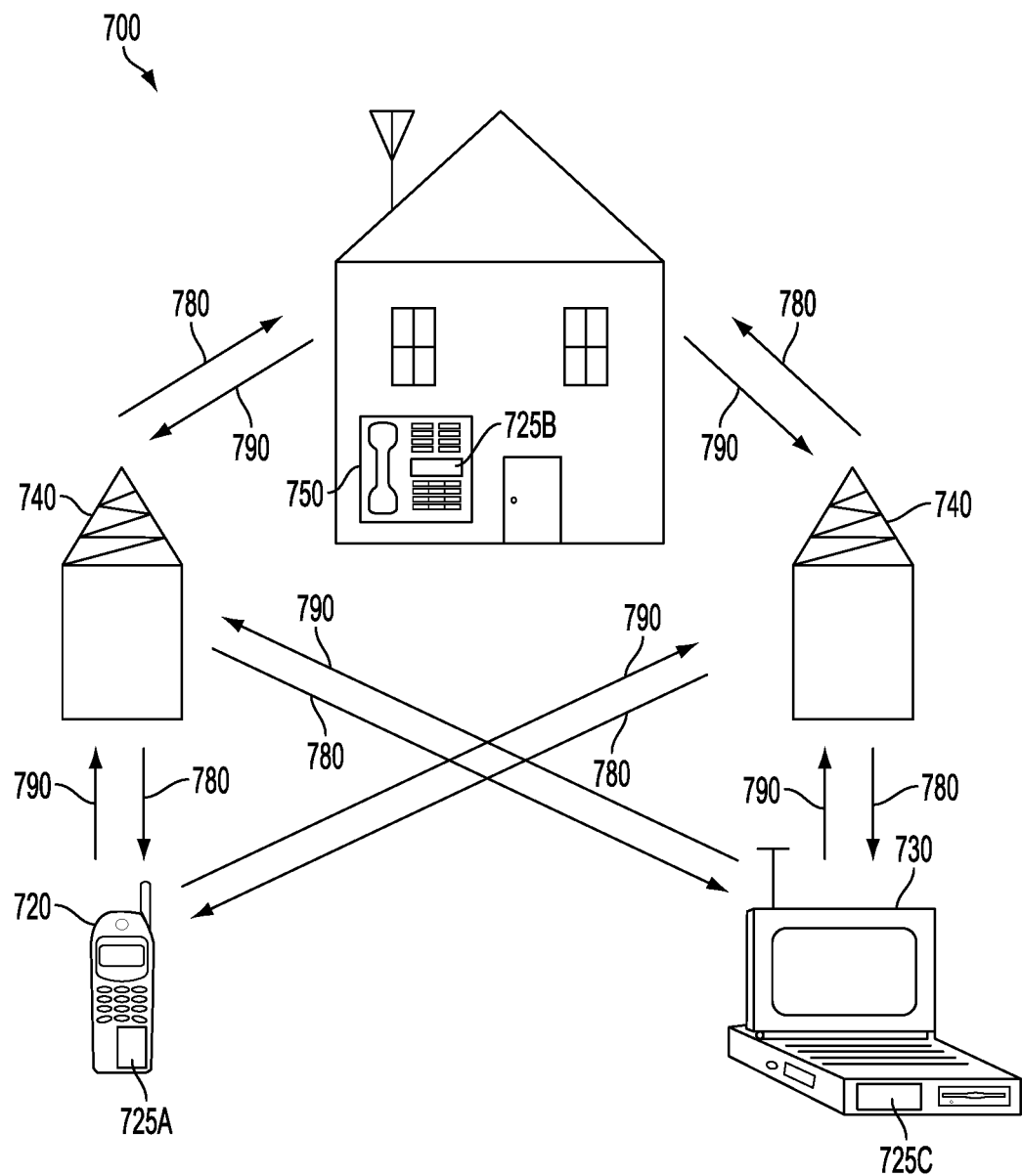
FIG. 7 is a block diagram showing an exemplary wireless communications system in which an aspect of the present disclosure may be advantageously employed.

FIG. 7 is a block diagram showing an exemplary wireless communications system 700 in which an aspect of the present disclosure may be advantageously employed. For purposes of illustration, FIG. 7 shows three remote units 720, 730, and 750 and two base stations 740. It will be recognized that wireless communications systems may have many more remote units and base stations. Remote units 720, 730, and 750 include IC devices 725A, 725C, and 725B that include the disclosed HV multi-gate MOSFET. It will be recognized that other devices may also include the disclosed HV multi-gate MOSFET, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, remote units may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as meter reading equipment, or other communications device that stores or retrieves data or computer instructions, or combinations thereof. Although FIG. 7 illustrates remote units according to aspects of the present disclosure, the present disclosure is not limited to these exemplary illustrated units. Aspects of the present disclosure may be suitably employed in many devices, which include the disclosed HV multi-gate MOSFET.

Figure 8:
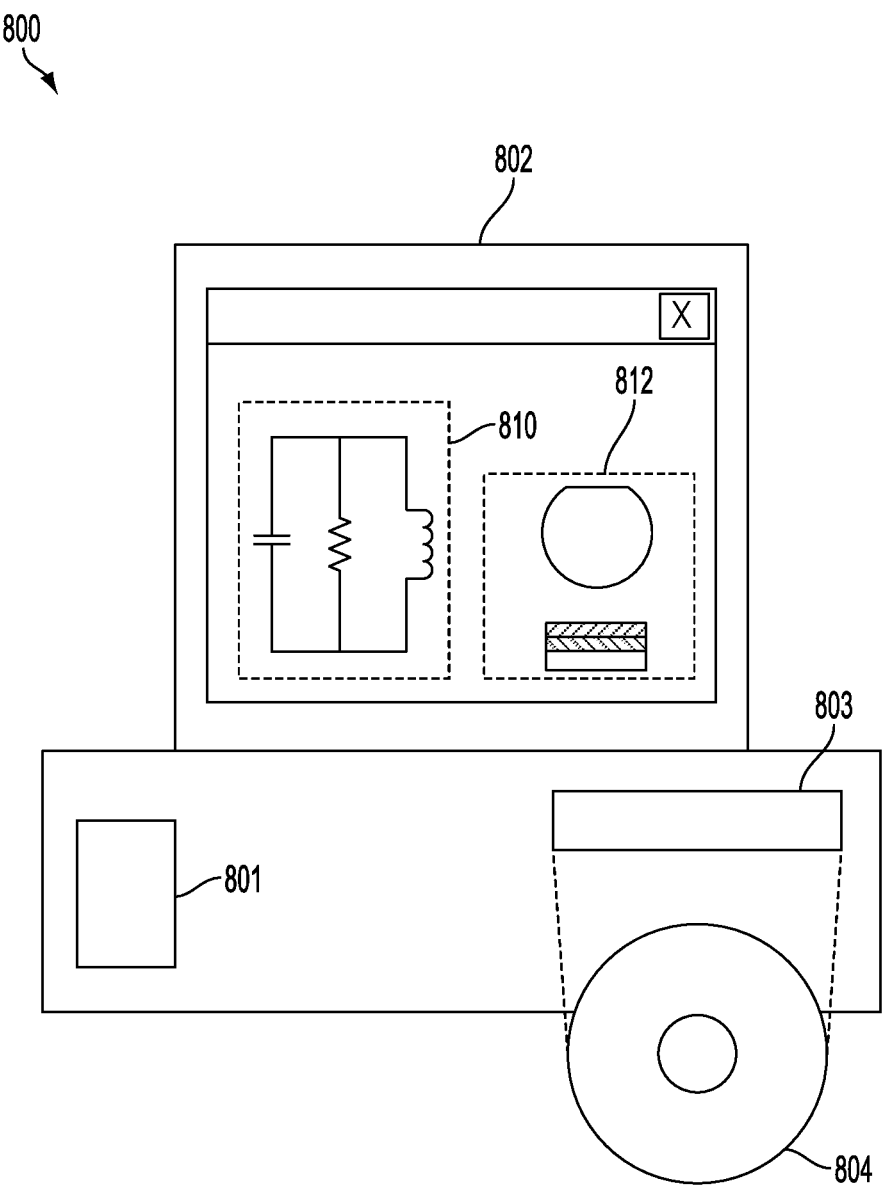
FIG. 8 is a block diagram illustrating a design workstation used for circuit, layout, and logic design of a semiconductor component, such as the RF devices disclosed above.

FIG. 8 is a block diagram illustrating a design workstation used for circuit, layout, and logic design of a semiconductor component, such as the HV multi-gate MOSFET disclosed above. A design workstation 800 includes a hard disk 801 containing operating system software, support files, and design software such as Cadence or OrCAD. The design workstation 800 also includes a display 802 to facilitate a circuit design 810 or an IC 812 having an HV multi-gate MOSFET. A storage medium 804 is provided for tangibly storing the circuit design 810 or the IC 812. The circuit design 810 or the IC 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the IC 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit, comprising:
    a metal oxide semiconductor field effect transistor (MOSFET) on a first surface of an insulator layer, the MOSFET including a source region, a drain region, a front gate, and an extended drain region between the drain region and a well proximate the front gate; and
    a plurality of discrete back gates on a second surface opposite the first surface of the insulator layer and overlapped by the extended drain region.

2. The integrated circuit of claim 1, wherein the plurality of discrete back gates comprises a first back gate and a second back gate on the second surface of the insulator layer.

3. The integrated circuit of claim 2, wherein the first back gate is at least partially overlapped by the front gate.

4. The integrated circuit of claim 2, wherein an overlap between the second back gate and the drain region is varied.

5. The integrated circuit of claim 1, wherein the MOSFET is a component of a high voltage power amplifier.

6. The integrated circuit of claim 1, wherein the MOSFET is a component of a high voltage switch.

7. The integrated circuit of claim 1, wherein the plurality of discrete back gates are biased independently from the front gate.

8. The integrated circuit of claim 1, integrated into an RF front-end module, the RF front-end module incorporated into at least one of a music player, a video player, an entertainment unit, a navigation device, a communications device, a personal digital assistant (PDA), a fixed location data unit, a mobile phone, and a portable computer.

9. An integrated circuit, comprising:
    a metal oxide semiconductor field effect transistor (MOSFET) on a first surface of an insulator layer, the MOSFET including a source region, a drain region, a front gate, and an extended drain region between the drain region and a well proximate the front gate; and
    a plurality of discrete means for increasing a voltage tolerance of the MOSFET, the means for increasing voltage tolerance on a second surface opposite the first surface of the insulator layer and overlapped by the extended drain region.

10. The integrated circuit of claim 9, wherein the plurality of discrete means for increasing the voltage tolerance is at least partially overlapped by the front gate.

11. The integrated circuit of claim 9, wherein an overlap between the plurality of discrete means for increasing the voltage tolerance and the drain region is varied.

12. The integrated circuit of claim 9, wherein the MOSFET is a component of a high voltage power amplifier.

13. The integrated circuit of claim 9, wherein the MOSFET is a component of a high voltage switch.

14. The integrated circuit of claim 9, wherein the plurality of discrete means for increasing the voltage tolerance is biased independently from the front gate.

15. The integrated circuit of claim 9, integrated into an RF front-end module, the RF front-end module incorporated into at least one of a music player, a video player, an entertainment unit, a navigation device, a communications device, a personal digital assistant (PDA), a fixed location data unit, a mobile phone, and a portable computer.

* * * * *